United States Patent
Takagi et al.

(10) Patent No.: US 9,362,192 B2
(45) Date of Patent: Jun. 7, 2016

(54) SEMICONDUCTOR DEVICE COMPRISING HEAT DISSIPATING CONNECTOR

(71) Applicant: Kabushiki Kaisha Toshiba, Minato-ku, Tokyo (JP)

(72) Inventors: Hajime Takagi, Kanazawa (JP); Takeshi Miyakawa, Kanazawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/300,638

(22) Filed: Jun. 10, 2014

(65) Prior Publication Data

US 2015/0214138 A1    Jul. 30, 2015

(30) Foreign Application Priority Data

Jan. 30, 2014  (JP) ................. 2014-015294

(51) Int. Cl.
- *H01L 23/24* (2006.01)
- *H01L 23/28* (2006.01)
- *H01L 23/433* (2006.01)
- *H01L 23/492* (2006.01)
- *H01L 23/00* (2006.01)
- *H01L 23/31* (2006.01)
- *H01L 23/495* (2006.01)

(52) U.S. Cl.
CPC ............ *H01L 23/28* (2013.01); *H01L 23/3107* (2013.01); *H01L 23/4334* (2013.01); *H01L 23/492* (2013.01); *H01L 23/49568* (2013.01); *H01L 23/564* (2013.01); *H01L 24/36* (2013.01); *H01L 24/40* (2013.01); *H01L 24/41* (2013.01); *H01L 23/49541* (2013.01); *H01L 23/49548* (2013.01); *H01L 23/49562* (2013.01); *H01L 2224/0603* (2013.01); *H01L 2224/32245* (2013.01); *H01L 2224/40245* (2013.01); *H01L 2224/4103* (2013.01); *H01L 2924/13055* (2013.01); *H01L 2924/13091* (2013.01); *H01L 2924/181* (2013.01)

(58) Field of Classification Search
CPC ............... H01L 2224/32058; H01L 23/49568; H01L 23/3675
See application file for complete search history.

(56) References Cited

U.S. PATENT DOCUMENTS

| | | | | |
|---|---|---|---|---|
| 5,854,511 A | * | 12/1998 | Shin et al. | 257/713 |
| 6,917,103 B2 | * | 7/2005 | Hirano et al. | 257/707 |
| 7,683,464 B2 | * | 3/2010 | Sun et al. | 257/666 |
| 7,880,288 B2 | * | 2/2011 | Otremba | 257/693 |
| 2010/0176508 A1 | * | 7/2010 | Herbsommer et al. | 257/718 |
| 2012/0001308 A1 | * | 1/2012 | Fukutani et al. | 257/675 |

FOREIGN PATENT DOCUMENTS

| | | |
|---|---|---|
| JP | 2008-124390 A | 5/2008 |
| WO | 2011077781 A1 | 6/2011 |

* cited by examiner

*Primary Examiner* — John C Ingham
(74) *Attorney, Agent, or Firm* — White & Case LLP (57) ABSTRACT

According to one embodiment, the connector includes a first portion and a second portion. The first portion is provided on the second surface of the semiconductor chip and bonded to the second electrode. The first portion has a bonding surface, a heat dissipation surface, and a side surface. The bonding surface is bonded to the second electrode of the semiconductor chip. The heat dissipation surface is opposite to the bonding surface and exposed from the resin. The side surface is tilted with respect to the bonding surface and the heat dissipation surface, and covered with the resin. The second portion protrudes from the first portion toward the second leadframe side. The second portion is thinner than the first portion and bonded to the second leadframe.

20 Claims, 9 Drawing Sheets

SEMICONDUCTOR DEVICE COMPRISING HEAT DISSIPATING CONNECTOR

CROSS-REFERENCE TO RELATED APPLICATION

This application is based upon and claims the benefit of priority from Japanese Patent Application No. 2014-015294, filed on Jan. 30, 2014; the entire contents of which are incorporated herein by reference.

FIELD

Embodiments described herein relate generally to a semiconductor device.

BACKGROUND

In power devices of recent years, connection structures between the chip and the outer leads have been proposed to reduce the resistance by using a connector or a strap having a plate configuration of copper, etc., instead of wire bonding; and the number of products having such connection structures is increasing.

Also, a structure has been proposed in which the connector that is mounted on the chip is exposed from the resin and heat dissipation occurs from both the package lower surface on the mounting substrate side and the package upper surface. In such a structure, there is a risk of unique problems occurring when the package upper surface is exposed; and it is necessary to solve such problems.

DETAILED DESCRIPTION

According to one embodiment, a semiconductor device includes a first leadframe, a second leadframe provided to be separated from the first leadframe, a semiconductor chip provided on the first leadframe, a resin sealing the semiconductor chip, and a connector. The semiconductor chip includes a semiconductor layer, a first electrode, and a second electrode. The semiconductor layer has a first surface and a second surface opposite to the first surface. The first electrode is provided on the first surface and bonded to the first leadframe. The second electrode is provided on the second surface. The connector includes a first portion and a second portion. The first portion is provided on the second surface of the semiconductor chip and bonded to the second electrode. The first portion has a bonding surface, a heat dissipation surface, and a side surface. The bonding surface is bonded to the second electrode of the semiconductor chip. The heat dissipation surface is opposite to the bonding surface and exposed from the resin. The side surface is tilted with respect to the bonding surface and the heat dissipation surface, and covered with the resin. The second portion protrudes from the first portion toward the second leadframe side. The second portion is thinner than the first portion and bonded to the second leadframe.

Embodiments will now be described with reference to the drawings. In the drawings, the same components are marked with like reference numerals.

Figure 1:
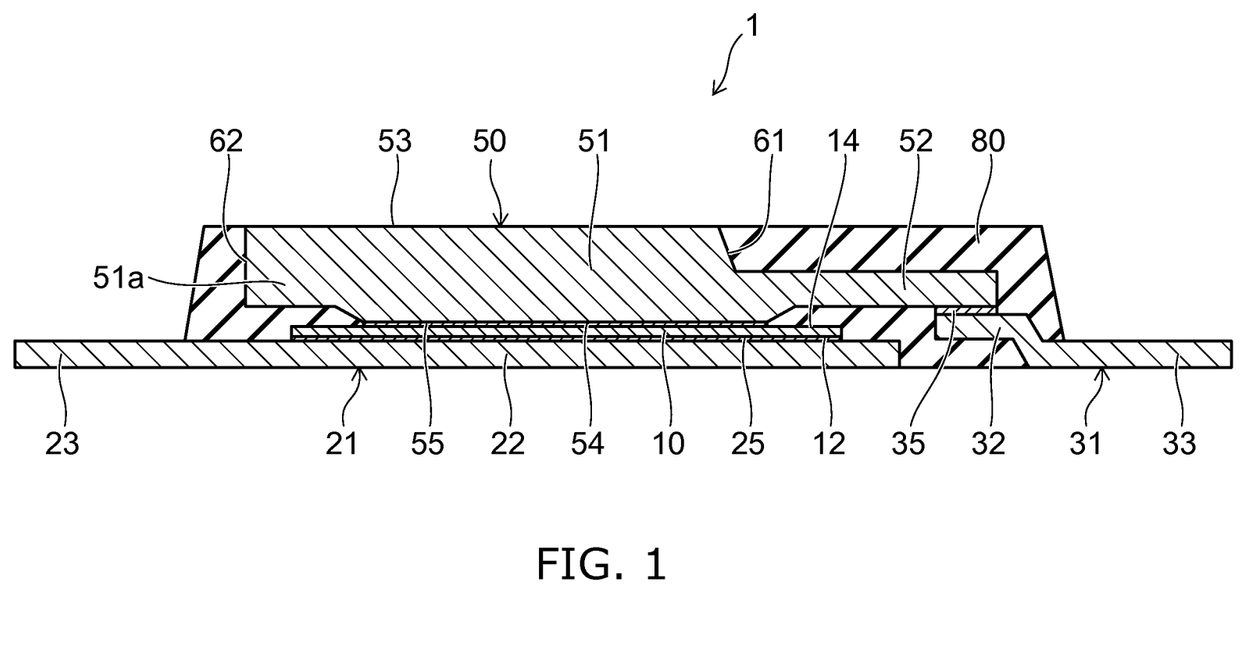
FIG. 1 is a schematic cross-sectional view of a semiconductor device of an embodiment.

FIG. 1 is a schematic cross-sectional view of a semiconductor device 1 of an embodiment.

Figure 2A:
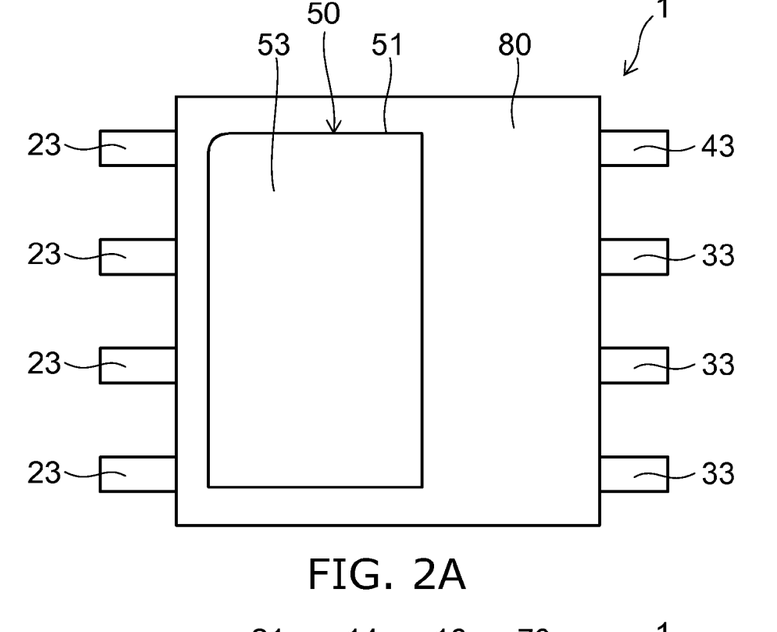
FIGS. 2A and 2B are schematic top views of the semiconductor device of the embodiment.
Figure 2B:
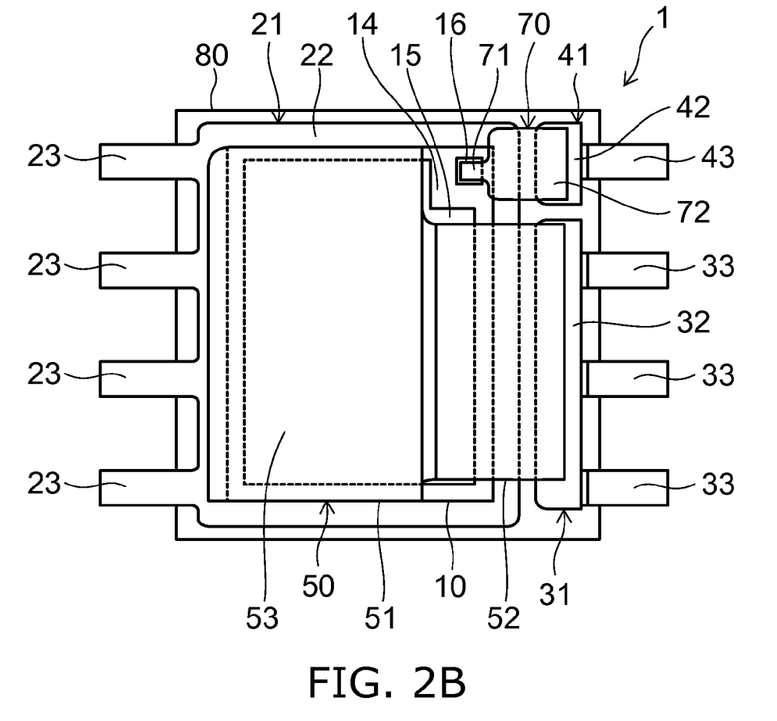

FIG. 2A is a schematic top view of the semiconductor device 1 of the embodiment; and FIG. 2B is a schematic top view without a resin 80. Only the outline of the side surfaces of the resin 80 is shown in FIG. 2B.

The semiconductor device 1 of the embodiment includes a semiconductor chip 10, leadframes 21, 31, and 41 that are electrically connected to the semiconductor chip 10, a connector 50 that connects the semiconductor chip 10 and the leadframe 31, and the resin 80 that seals these components.

The semiconductor chip 10 is a vertical device in which a current path is formed in a vertical direction between a first electrode provided on the surface on one side of the semiconductor layer and a second electrode provided on the surface on one other side. The semiconductor chip 10 is, for example, a vertical MOSFET (Metal Oxide-Semiconductor Field Effect Transistor). Or, the semiconductor chip 10 is a vertical IGBT (Insulated Gate Bipolar Transistor) or a vertical diode.

Silicon is used as the semiconductor. Or, a semiconductor (e.g., a compound semiconductor such as SiC, GaN, etc.) other than silicon may be used.

Figure 3A:
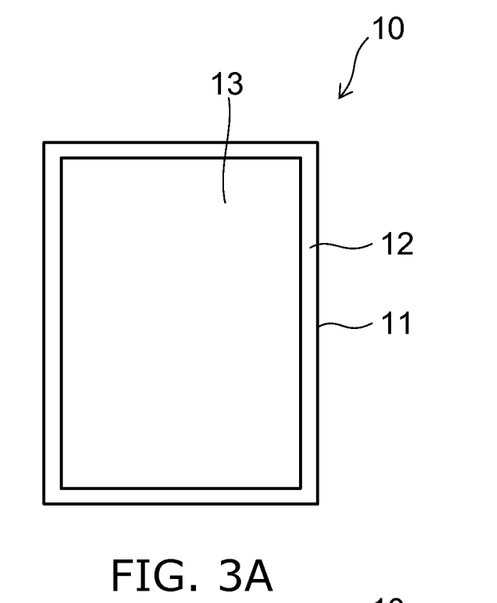
FIGS. 3A and 3B are schematic plan views of a semiconductor chip of the embodiment.
Figure 3B:
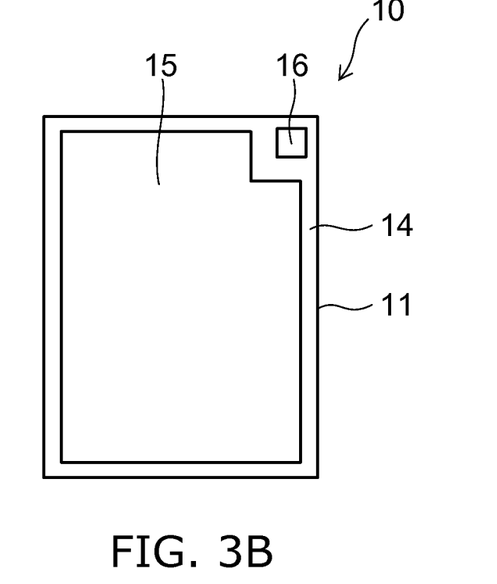

FIG. 3A is a schematic plan view of a first surface 12 of the semiconductor chip 10; and FIG. 3B is a schematic plan view of a second surface 14 on the side opposite to the first surface 12.

As shown in FIG. 3A, a first electrode 13 is formed on the first surface 12 of a semiconductor layer 11. For example, in a MOSFET, the first electrode 13 is a drain electrode. The first electrode 13 is formed to occupy a greater part of the first surface 12.

As shown in FIG. 3B, a second electrode 15 and a third electrode 16 are formed on the second surface 14 of the semiconductor layer 11 to be insulatively separated from each other. The second electrode 15 is formed to occupy a greater part of the second surface 14 and is, for example, a source electrode of the MOSFET. The surface area of the third electrode 16 is less than the surface area of the second electrode 15; and the third electrode 16 is, for example, a gate electrode of the MOSFET.

As shown in FIG. 2B, the first leadframe 21 includes a die pad 22 and multiple leads 23. The planar configuration of the die pad 22 is formed in a quadrilateral configuration; and the multiple leads 23 protrude from one side of the quadrilateral configuration. The first leadframe 21 is formed by stamping a metal plate; and the die pad 22 and the leads 23 are provided as a single body.

The second leadframe 31 is provided on the side of the first leadframe 21 opposite to the protruding direction of the leads 23 and is separated from the first leadframe 21.

The second leadframe 31 includes an inner lead 32 provided on the first leadframe 21 side, and multiple outer leads 33 protruding from the inner lead 32. The outer leads 33 protrude in the reverse direction of the protruding direction of the leads 23 of the first leadframe 21. The inner lead 32 extends in a direction orthogonal to the protruding direction of the outer leads 33 and the protruding direction of the leads 23 of the first leadframe 21.

The second leadframe 31 is formed by stamping a metal plate; and the inner lead 32 and the outer leads 33 are provided as a single body.

The third leadframe 41 also is provided to be separated from the first leadframe 21 on the side of the first leadframe 21 opposite to the protruding direction of the leads 23. The third leadframe 41 is provided to be adjacent to the second leadframe 31 in the longitudinal direction of the inner lead 32. The third leadframe 41 is separated from the second leadframe 31.

The third leadframe 41 includes an inner lead 42 provided on the first leadframe 21 side and one outer lead 43 protruding from the inner lead 42. The outer lead 43 protrudes in the same direction as the protruding direction of the outer leads 33 of the second leadframe 31.

As shown in FIG. 1, there is no difference in levels between the die pad 22 and the leads 23 of the first leadframe 21; the upper surfaces of the leads 23 and the upper surface of the die pad 22 are continuous in a flat configuration; and the lower surfaces of the leads 23 and the lower surface of the die pad 22 are continuous in a flat configuration.

The second leadframe 31 is bent at a portion between the inner lead 32 and the outer leads 33; and a difference in levels is formed between the inner lead 32 and the outer leads 33. Similarly to the second leadframe 31, the third leadframe 41 is bent at a portion between the inner lead 42 and the outer lead 43; and a difference in levels is formed between the inner lead 42 and the outer lead 43.

The lower surfaces of the outer leads 33 of the second leadframe 31 are at the same height level as the lower surface of the first leadframe 21 (the lower surfaces of the leads 23 and the lower surface of the die pad 22). The lower surface of the outer lead 43 of the third leadframe 41 is at the same height level as the lower surface of the first leadframe 21 and the lower surfaces of the outer leads 33 of the second leadframe 31.

The upper surfaces of the inner leads 32 and 42 are positioned higher than the upper surface of the die pad 22 when the lower surfaces of the outer leads 33 and 43 and the lower surface of the first leadframe 21 are used as a height-direction (a vertical-direction) reference.

The semiconductor chip 10 is mounted on the die pad 22 of the first leadframe 21. The first surface 12 of the semiconductor chip 10 where the first electrode 13 is formed is oriented toward the die pad 22 side.

The first electrode 13 is bonded to the die pad 22 via an electrically conductive bonding agent (e.g., solder) 25 shown in FIG. 1. Accordingly, the first electrode 13 of the semiconductor chip 10 is electrically connected to the first leadframe 21.

The connector 50 is mounted on the second surface 14 of the semiconductor chip 10. The connector 50 includes a first portion 51 and a second portion 52. The thicknesses of the first portion 51 and the second portion 52 are different from each other; and the first portion 51 is thicker than the second portion 52.

The connector 50 is formed by stamping a metal plate; and the first portion 51 and the second portion 52 are provided as a single body. The connector 50 is made of, for example, copper which has excellent electrical conduction and thermal conduction. A copper alloy that has copper as a major component may be used as the connector 50.

The first portion 51 is thicker than the leadframe 21, thicker than the leadframe 31, and thicker than the leadframe 41, e.g., not less than 0.5 mm and not more than 1 mm. The first portion 51 has a bonding surface 54 that is bonded to the second electrode 15 of the semiconductor chip 10 via, for example, an electrically conductive bonding agent 55 such as solder, etc. The first portion 51 also has a heat dissipation surface 53 that is exposed from the resin 80 and formed on the side opposite to the bonding surface 54.

The second portion 52 protrudes from the first portion 51 toward the second leadframe 31 side. The tip portion of the second portion 52 overlaps the inner lead 32 of the second leadframe 31 from above and is bonded to the upper surface of the inner lead 32 via, for example, an electrically conductive bonding agent 35 such as solder, etc.

Accordingly, the connector 50 electrically connects the second leadframe 31 and the second electrode 15 of the semiconductor chip 10.

Also, as shown in FIG. 2B, the third leadframe 41 and the third electrode (the gate electrode) 16 of the semiconductor chip 10 are electrically connected by a gate connector 70. Or, the third electrode 16 and the third leadframe 41 may be connected by wire bonding.

One end portion 71 of the gate connector 70 is bonded to the third electrode 16 via, for example, an electrically conductive bonding agent such as solder, etc. One other end portion 72 of the gate connector 70 overlaps the inner lead 42 of the third leadframe 41 from above and is bonded to the upper surface of the inner lead 42 of the third leadframe 41 via, for example, an electrically conductive bonding agent such as solder, etc.

The electrically conductive bonding agent described above is not limited to solder; and, for example, an electrically conductive paste such as a silver paste may be used.

The semiconductor chip 10 is protected from the external environment by being resin-sealed. The resin 80 covers the semiconductor chip 10, the upper surface of the die pad 22, the inner lead 32 of the second leadframe 31, the inner lead 42 of the third leadframe 41, the side surface of the first portion 51 of the connector 50, and the second portion 52 of the connector 50.

The resin 80 also covers the bonding portion between the first electrode 13 and the die pad 22, the bonding portion between the second electrode 15 and the connector 50, the bonding portion between the second portion 52 of the connector 50 and the inner lead 32 of the second leadframe 31, and the bonding portion between the third electrode 16 and the inner lead 42 of the third leadframe 41.

The lower surface of the first leadframe 21 (the lower surfaces of the leads 23 and the lower surface of the die pad 22), the lower surfaces of the outer leads 33 of the second leadframe 31, and the lower surface of the outer lead 43 of the third leadframe 41 are exposed from the resin 80 without being covered with the resin 80.

The lower surface of the first leadframe 21, the lower surfaces of the outer leads 33 of the second leadframe 31, and the lower surface of the outer lead 43 of the third leadframe 41 are bonded to the conductor pattern of a not-shown mounting substrate (interconnect substrate) by, for example, solder.

As shown in FIG. 1 and FIG. 2A, the upper surface of the first portion 51 of the connector 50 is exposed from the resin 80 and functions as the heat dissipation surface 53. Also, a heat sink may be bonded to the heat dissipation surface 53 of the connector 50 as necessary.

The heat that is generated by the semiconductor chip 10 is dissipated not only to the mounting substrate via the die pad 22 which has a surface area wider than that of the first electrode 13 but also outside the semiconductor device 1 (e.g., into the air) via the heat dissipation surface 53 of the connector 50. In other words, the semiconductor device 1 of the embodiment has a double-sided cooling package structure; and the heat dissipation can be high particularly for power applications in which the amount of heat generated by the chip tends to be large.

The first portion 51 of the connector 50 not only is electrically connected to the semiconductor chip 10 and the second leadframe 31 but also functions as a dissipator that dissipates heat in the direction opposite to the mounting surface. The first portion 51 of the connector 50 is mounted directly above the semiconductor chip 10; and the ratio of the surface area of the bonding surface between the second electrode 15 and the first portion 51 to the surface area of the second electrode 15 of the semiconductor chip 10 is not less than 80%. Also, the ratio of the surface area of the heat dissipation surface 53 of the connector 50 to the surface area of the second electrode 15 of the semiconductor chip 10 is not less than 100%.

In other words, the surface of a greater part of the second electrode 15 is used as the thermally conductive surface for the connector 50; and the heat that is conducted to the connector 50 is dissipated outside the semiconductor device 1 from the heat dissipation surface 53 which has a surface area not less than that of the second electrode 15. Therefore, the connector 50 can be utilized effectively as a dissipator having a very high heat dissipation efficiency.

Rather than making the entire connector 50 thick, a region of the connector 50 that is covered with the resin 80 is provided on the upper surface side of the connector 50 by providing the second portion 52 that is thinner than the first portion 51. In other words, the resin 80 covers the upper surface of the connector 50 at the second portion 52. In this structure, the second portion 52 juts into the resin 80. Therefore, peeling of the resin 80 (detachment of the connector 50) is suppressed better than for a structure in which the entire upper surface of the connector 50 is exposed from the resin 80.

A side surface 61 that continues from the heat dissipation surface 53 toward the second portion 52 is tilted with respect to the heat dissipation surface 53 and the bonding surface 54. The side surface 61 is tapered such that an obtuse angle is formed between the heat dissipation surface 53 and the side surface 61.

Therefore, even for the first portion 51 where the upper surface (the heat dissipation surface) 53 is exposed, a force acts to press the first portion 51 from above due to the resin 80 that covers the side surface 61; and the detachment of the connector 50 can be suppressed.

Figure 4:
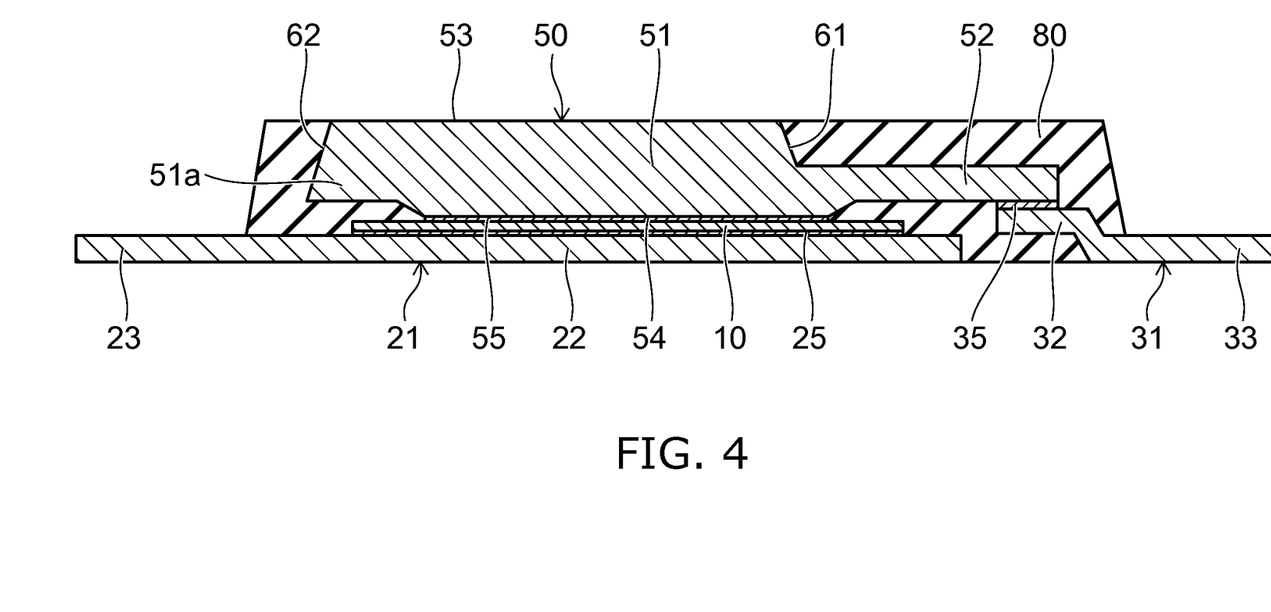
FIG. 4 is a schematic cross-sectional view of a semiconductor device of the embodiment.

As shown in FIG. 4, a side surface 62 of the connector 50 that is on the side opposite to the direction in which the second portion 52 protrudes toward the second leadframe 31 side also may be tilted with respect to the heat dissipation surface 53 and the bonding surface 54. An obtuse angle is formed between the heat dissipation surface 53 and the side surface 62.

In such a case as well, even for the first portion 51 where the upper surface (the heat dissipation surface) 53 is exposed, a force acts to press the first portion 51 from above due to the resin 80 that covers the side surface 62; and the detachment of the connector 50 can be suppressed.

In the structure in which the upper surface (the heat dissipation surface) 53 of the connector 50 is exposed from the resin 80, in the case where adhesion defects between the connector 50 and the resin 80 occur, moisture penetrates from the boundary between the heat dissipation surface 53 and the resin 80 toward the semiconductor chip 10; and the reliability of the semiconductor device may decrease.

However, according to the structure of FIG. 4, because the side surface 62 that extends downward from the boundary between the heat dissipation surface 53 and the resin 80 is tilted, the penetration path of the moisture from outside the semiconductor device to the semiconductor chip 10 is longer than that of the case where the side surface 62 is perpendicular to the heat dissipation surface 53 as in FIG. 1; discrepancies such as leaks, etc., due to the moisture penetration can be prevented; and the reliability can be increased.

Because the side surface 62 is tilted such that the lower end of the side surface 62 is disposed more toward the outer side of the semiconductor chip 10 than is the upper end of the side surface 62 and an obtuse angle is formed between the side surface 62 and the heat dissipation surface 53, the moisture can be prevented from reaching the semiconductor chip 10 more effectively.

Although only the side surface 61 on the second portion 52 side and the side surface 62 on the side opposite to the side surface 61 are shown in FIG. 4, all of the side surfaces of the first portion 51 may be tilted to form obtuse angles with the heat dissipation surface 53.

Figure 5:
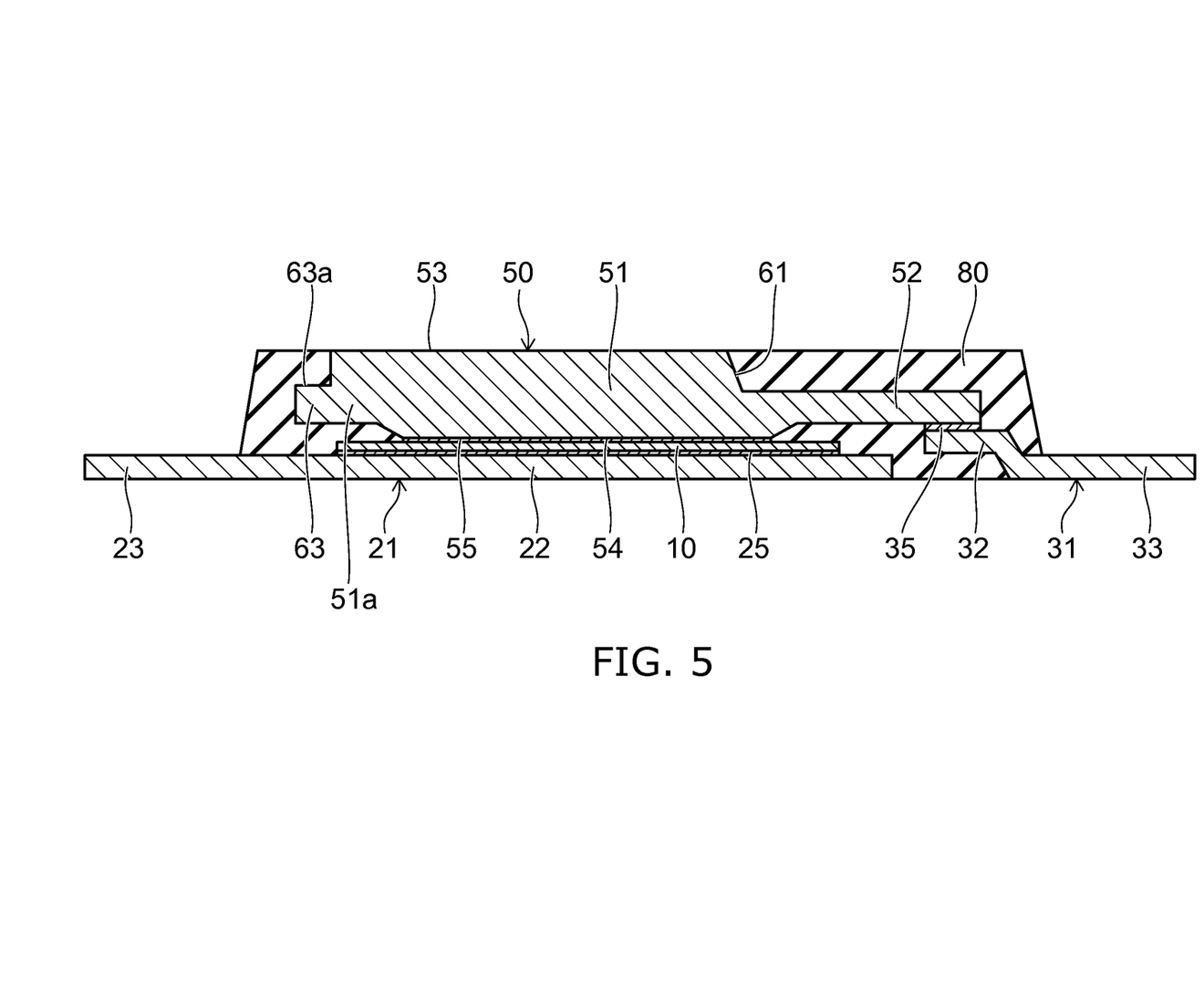
FIG. 5 is a schematic cross-sectional view of a semiconductor device of the embodiment.
Figure 6A:
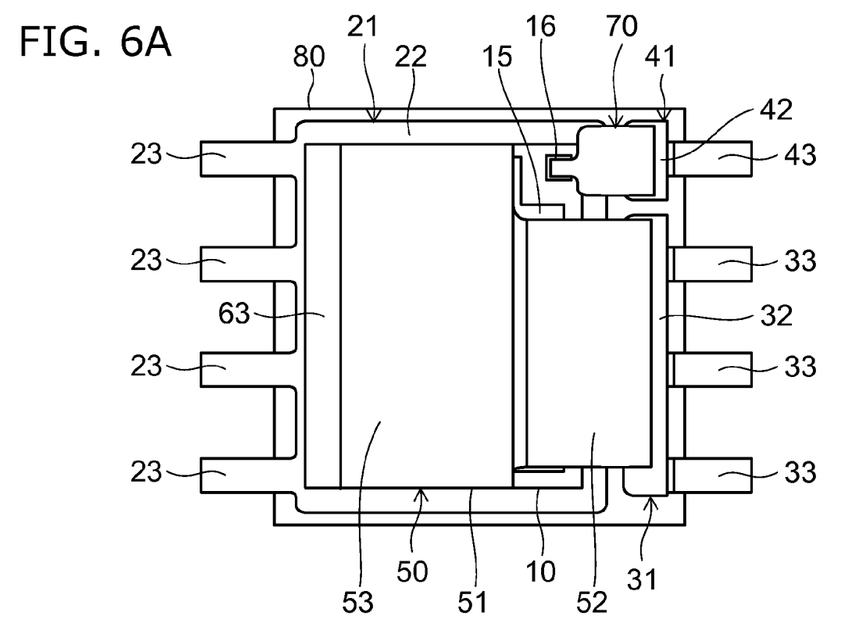
FIGS. 6A and 6B are schematic top views of the semiconductor device of the embodiment.

Further, as shown in FIG. 5 and FIG. 6A, a protruding portion 63 that protrudes in a direction (a reverse direction) different from the protruding direction of the second portion 52 may be provided at the side surface on the side opposite to the second portion 52. An upper surface 63a of the protruding portion 63 is positioned further on the semiconductor chip 10 side than is the heat dissipation surface 53; and a difference in levels is formed between the heat dissipation surface 53 and the upper surface 63a of the protruding portion 63.

The peeling of the resin 80 (the detachment of the connector 50) can be suppressed because the protruding portion 63 juts such that the resin 80 extends onto the protruding portion 63.

The interface between the connector 50 and the resin 80, i.e., the penetration path of the moisture, is formed from the boundary between the heat dissipation surface 53 and the resin 80 toward the interior of the resin 80 and is bent partway. Therefore, compared to the case where there is no protruding portion 63 and the side surface of the first portion 51 continues downward perpendicular to the heat dissipation surface 53, the penetration path of the moisture from outside the semiconductor device to the semiconductor chip 10 is longer; and the reliability can be increased.

Figure 6B:
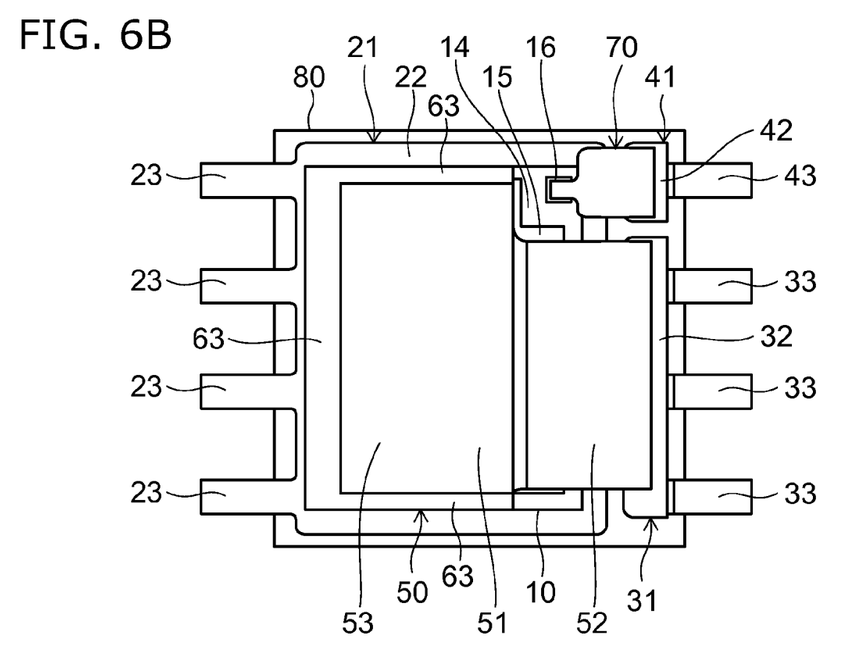

The protruding portion 63 is not limited to being provided only at the side surface on the side opposite to the second portion 52 and may be provided at the three sides of the first portion 51 other than the side on the second portion 52 side as shown in FIG. 6B.

Figure 7:
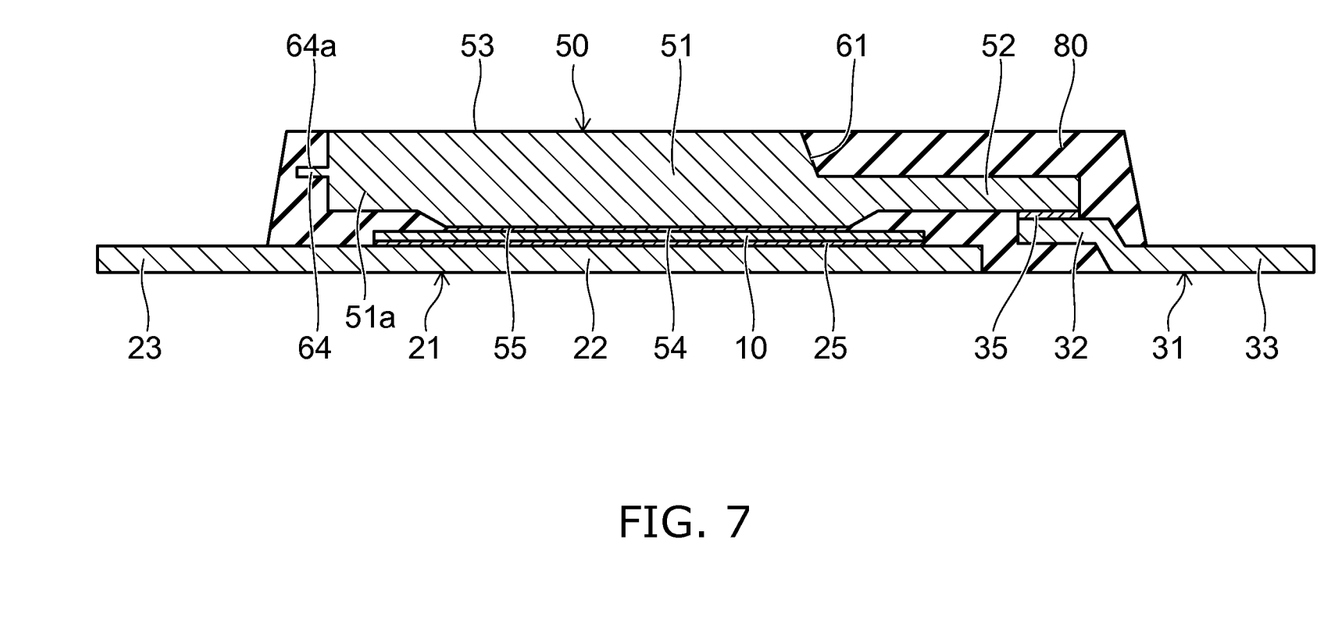
FIG. 7 is a schematic cross-sectional view of a semiconductor device of the embodiment.
Figure 8A:
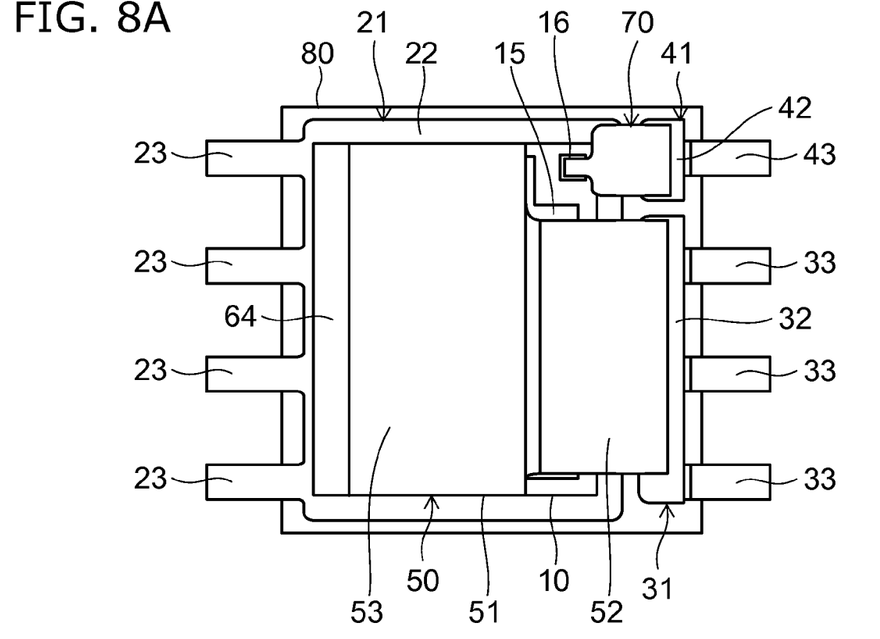
FIG. 8A and FIG. 8B are schematic top views of a semiconductor device of an embodiment.

Further, the protruding portion that is provided at the side surface of the first portion 51 is not limited to a configuration continuing to the lower end of the side surface and may be provided in an eave-like configuration partway down the first portion 51 in the thickness direction of the first portion 51 similar to a protruding portion 64 shown in FIG. 7 and FIG. 8A.

An upper surface 64a of the protruding portion 64 is positioned further on the semiconductor chip 10 side than is the heat dissipation surface 53; and a difference in levels is formed between the heat dissipation surface 53 and the upper surface 64a of the protruding portion 64.

Because the protruding portion 64 juts into the resin 80, the peeling of the resin 80 (the detachment of the connector 50) can be suppressed.

Also, the interface between the connector 50 and the resin 80, i.e., the penetration path of the moisture, is formed from the boundary between the heat dissipation surface 53 and the resin 80 toward the interior of the resin 80 and is bent partway. Therefore, compared to the case where there is no protruding portion 64 and the side surface of the first portion 51 continues downward perpendicular to the heat dissipation surface 53, the penetration path of the moisture from outside the semiconductor device to the semiconductor chip 10 is longer; and the reliability can be increased.

Figure 8B:
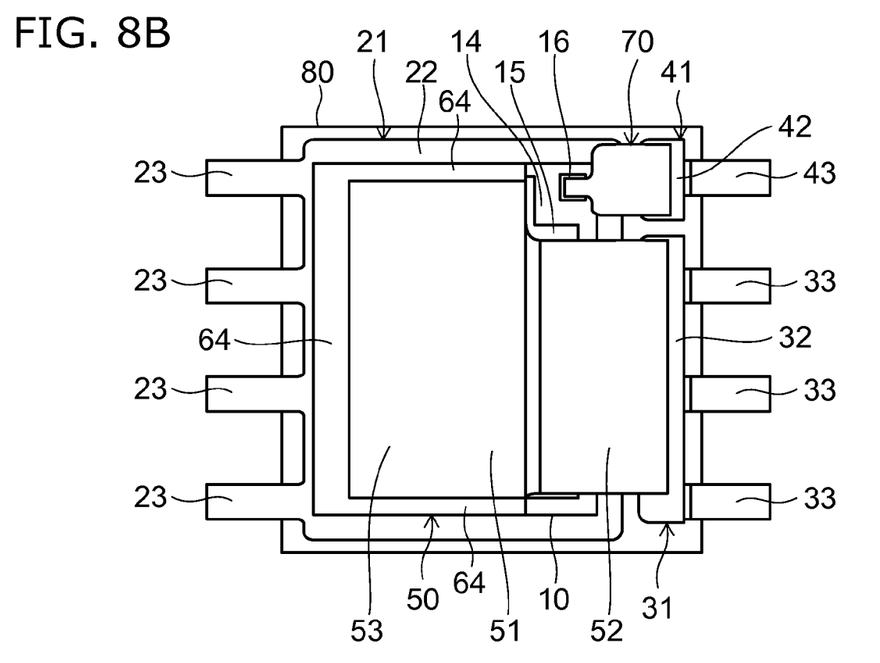

The protruding portion 64 is not limited to being provided only at the side surface on the side opposite to the second portion 52 and may be provided at the three sides of the first portion 51 other than the side on the second portion 52 side as shown in FIG. 8B.

Figure 9:
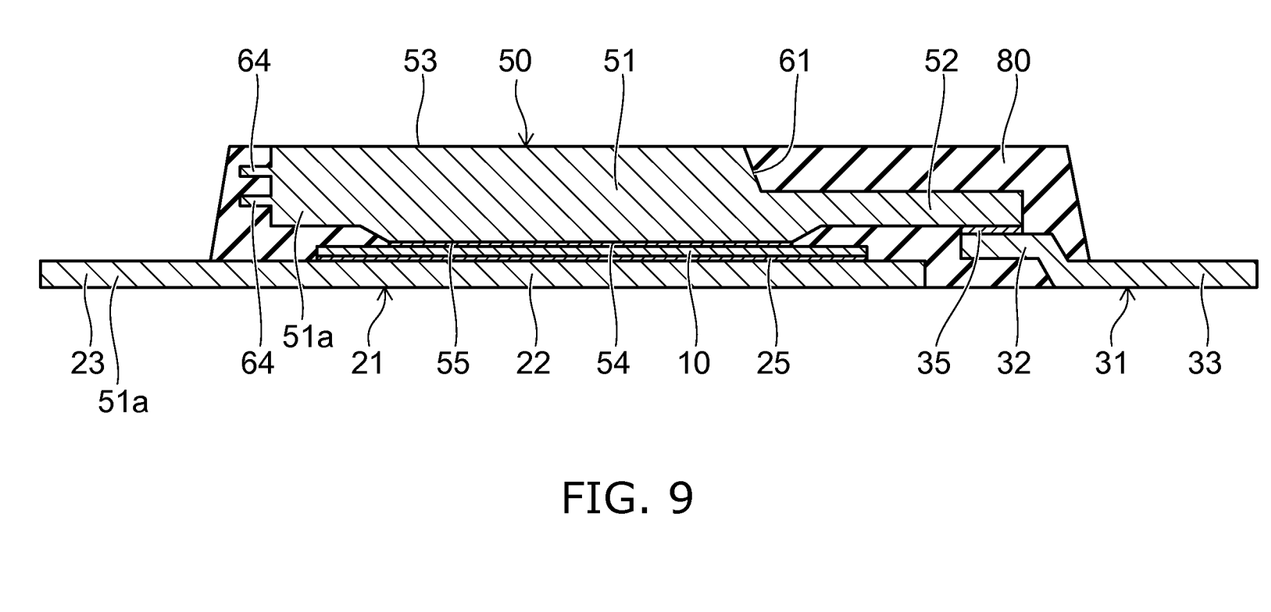
FIG. 9 is a schematic cross-sectional view of a semiconductor device of the embodiment.

Further, as shown in FIG. 9, multiple protruding portions 64 that are arranged in the thickness direction of the first portion 51 may be provided at the side surface of the first portion 51.

The side surface of the first portion 51 that continues from the heat dissipation surface 53 and is positioned further on the heat dissipation surface 53 side than is the protruding portion may be tilted similarly to the side surface 62 shown in FIG. 4.

As shown in FIG. 1, etc., an end portion 51a of the first portion 51 of the connector 50 overlaps the semiconductor chip 10 from above in an eave-like configuration with the resin 80 interposed. The connector 50 overlaps the semiconductor chip 10 with the resin 80 interposed at the portion outside (on the chip edge side of) the bonding surface between the semiconductor chip 10 and the connector 50.

For example, when heating to mount the semiconductor device to the mounting substrate, the resin 80 that is between the semiconductor chip 10 and the end portion 51a of the connector 50 is closely adhered to the semiconductor chip 10 such that the resin 80 presses the semiconductor chip 10 due to thermal expansion.

Therefore, peeling of the resin 80 that is on the semiconductor chip 10 can be suppressed; and the penetration of moisture into the semiconductor chip 10 can be suppressed.

In the case where there is no eave-like portion of the connector 50 to cover the edge-side region of the semiconductor chip 10, there is nothing to restrict the thermal expansion (in particular, the expansion in the upward direction) of the resin 80; and the force of the resin 80 restraining the semiconductor chip 10 is weak.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a first leadframe;
   a second leadframe provided to be separated from the first leadframe;
   a semiconductor chip provided on the first leadframe, the semiconductor chip including a semiconductor layer, a first electrode, and a second electrode, the semiconductor layer having a first surface and a second surface opposite to the first surface, the first electrode being provided on the first surface and bonded to the first leadframe, the second electrode being provided on the second surface;
   a resin sealing the semiconductor chip; and
   a connector including
      a first portion provided on the second surface of the semiconductor chip and bonded to the second electrode, the first portion having a bonding surface, an upper surface, and a side surface, the bonding surface being bonded to the second electrode of the semiconductor chip, the upper surface being opposite to the bonding surface and exposed from the resin, the side surface being tilted with respect to the bonding surface and the upper surface, and covered with the resin, and
      a second portion protruding from the first portion toward the second leadframe side, the second portion being thinner than the first portion and bonded to the second leadframe,
   wherein an obtuse angle is formed between the upper surface and the side surface being tilted.

2. The device according to claim 1, wherein a side surface of the first portion on a side opposite to the direction of the second portion protruding toward the second leadframe side is tilted.

3. The device according to claim 1, wherein
   the semiconductor chip further includes a third electrode provided on the second surface and insulatively separated from the second electrode,
   the semiconductor device further comprises a third leadframe provided to be separated from the first leadframe and the second leadframe, and
   the third electrode and the third leadframe are electrically connected to each other.

4. The device according to claim 1, wherein the connector includes copper.

5. The device according to claim 1, wherein a ratio of a surface area of the upper surface to a surface area of the second electrode is not less than 100%.

6. The device according to claim 1, wherein the second portion is covered with the resin.

7. The device according to claim 1, wherein a portion of the connector overlaps an edge-side region of the semiconductor chip with the resin interposed, the edge-side region being outside a bonding surface of the semiconductor chip for the connector.

8. The device according to claim 1, wherein a thickness of the first portion is thicker than a thickness of the first leadframe and a thickness of the second leadframe.

9. The device according to claim 1, wherein a thickness of the first portion is not less than 0.5 millimeters and not more than 1 millimeter.

10. A semiconductor device, comprising:
    a first leadframe;
    a second leadframe provided to be separated from the first leadframe;
    a semiconductor chip provided on the first leadframe, the semiconductor chip including a semiconductor layer, a first electrode, and a second electrode, the semiconductor layer having a first surface and a second surface opposite to the first surface, the first electrode being provided on the first surface and bonded to the first leadframe, the second electrode being provided on the second surface;
    a resin sealing the semiconductor chip; and
    a connector including a first portion and a second portion, the first portion being provided on the second surface of the semiconductor chip and bonded to the second electrode, the second portion protruding from the first portion toward the second leadframe side, the second portion being thinner than the first portion and bonded to the second leadframe, the first portion having a bonding surface, an upper surface, a side surface, and a protruding portion, the bonding surface being bonded to the second electrode of the semiconductor chip, the upper surface being opposite to the bonding surface and exposed from the resin, the side surface being covered with the resin and being tilted with respect to the bonding surface and the upper surface, the protruding portion being provided at the side surface and covered with the resin, the protruding portion protruding in a direction different from a protruding direction of the second portion, and wherein an obtuse angle is formed between the upper surface and the side surface being tilted.

11. The device according to claim 10, wherein an upper surface of the protruding portion is positioned further on the semiconductor chip side than is the upper surface of the first portion of the connector, and a difference in levels is formed between the upper surface of the first portion and the upper surface of the protruding portion.

12. The device according to claim 10, wherein
the semiconductor chip further includes a third electrode provided on the second surface and insulatively separated from the second electrode,
the semiconductor device further comprises a third leadframe provided to be separated from the first leadframe and the second leadframe, and
the third electrode and the third leadframe are electrically connected to each other.

13. The device according to claim 10, wherein the connector includes copper.

14. The device according to claim 10, wherein a ratio of a surface area of the upper surface of the first portion to a surface area of the second electrode is not less than 100%.

15. The device according to claim 10, wherein the second portion is covered with the resin.

16. The device according to claim 10, wherein a portion of the connector overlaps an edge-side region of the semiconductor chip with the resin interposed, the edge-side region being outside a bonding surface of the semiconductor chip for the connector.

17. The device according to claim 10, wherein a thickness of the first portion is thicker than a thickness of the first leadframe and a thickness of the second leadframe.

18. The device according to claim 10, wherein a thickness of the first portion is not less than 0.5 millimeters and not more than 1 millimeter.

19. A semiconductor device, comprising:
a first leadframe;
a second leadframe provided to be separated from the first leadframe;
a semiconductor chip provided on the first leadframe, the semiconductor chip including a semiconductor layer, a first electrode, and a second electrode, the semiconductor layer having a first surface and a second surface opposite to the first surface, the first electrode being provided on the first surface and bonded to the first leadframe, the second electrode being provided on the second surface;
a resin sealing the semiconductor chip; and
a connector including
a first portion provided on the second surface of the semiconductor chip and bonded to the second electrode, the first portion having a bonding surface, an upper surface, and a side surface, the bonding surface being bonded to the second electrode of the semiconductor chip, the upper surface being opposite to the bonding surface and exposed from the resin, the side surface being tilted with respect to the bonding surface and the upper surface, and covered with the resin, and
a second portion protruding from the first portion toward the second leadframe side, the second portion being thinner than the first portion and bonded to the second leadframe,
wherein the upper surface intersects the side surface being tilted.

20. The device according to claim 10, wherein the upper surface of the first portion intersects the side surface being tilted.

* * * * *